(12) United States Patent
Korovin et al.

(10) Patent No.: US 6,790,123 B2
(45) Date of Patent: Sep. 14, 2004

(54) METHOD FOR PROCESSING A WORK PIECE IN A MULTI-ZONAL PROCESSING APPARATUS

(75) Inventors: Nikolay Korovin, Phoenix, AZ (US); Stephen C. Schultz, Gilbert, AZ (US)

(73) Assignee: Speedfam-IPEC Corporation, Chandler, AZ (US)

( * ) Notice: Subject to any disclaimer, the term of this patent is extended or adjusted under 35 U.S.C. 154(b) by 309 days.

(21) Appl. No.: 10/147,418

(22) Filed: May 16, 2002

(65) Prior Publication Data

US 2003/0216104 A1 Nov. 20, 2003

(51) Int. Cl.$^7$ .................. B24B 49/00; B24B 51/00; B24B 1/00
(52) U.S. Cl. ................. 451/5; 451/8; 451/41; 451/54; 451/63
(58) Field of Search ............ 451/5, 8, 41, 285, 451/289, 63, 54

(56) References Cited

U.S. PATENT DOCUMENTS

| | | | |
|---|---|---|---|
| 5,205,082 A | 4/1993 | Shendon et al. | |
| 5,230,184 A | 7/1993 | Bukhman | |
| 5,584,746 A | 12/1996 | Tanaka et al. | |
| 5,584,751 A | 12/1996 | Kobayashi et al. | |
| 5,605,488 A | 2/1997 | Ohashi et al. | |
| 5,624,299 A | 4/1997 | Shendon | |
| 5,660,517 A | 8/1997 | Thompson et al. | |
| 5,681,215 A | 10/1997 | Sherwood et al. | |
| 5,738,574 A | 4/1998 | Tolles et al. | |
| 5,762,539 A | 6/1998 | Nakashiba et al. | |
| 5,762,544 A | 6/1998 | Zuniga et al. | |
| 5,762,546 A | 6/1998 | James et al. | |
| 5,795,215 A | 8/1998 | Guthrie et al. | |
| 5,820,448 A | 10/1998 | Shamouilian et al. | |
| 5,872,633 A * | 2/1999 | Holzapfel et al. | 356/630 |
| 5,948,203 A * | 9/1999 | Wang | 156/345.13 |
| 5,964,653 A | 10/1999 | Perlov et al. | |
| 6,093,089 A | 7/2000 | Chen et al. | |
| 6,261,157 B1 * | 7/2001 | Bajaj et al. | 451/57 |
| 6,276,989 B1 * | 8/2001 | Campbell et al. | 451/10 |
| 6,503,767 B2 * | 1/2003 | Korovin | 438/16 |
| 6,582,277 B2 * | 6/2003 | Korovin | 451/5 |

FOREIGN PATENT DOCUMENTS

| | | |
|---|---|---|
| EP | 0 786 310 A1 | 7/1997 |
| EP | 0 790 100 A1 | 8/1997 |
| EP | 0 791 431 A1 | 8/1997 |
| EP | 0 841 123 A1 | 5/1998 |

* cited by examiner

Primary Examiner—M. Rachuba
(74) Attorney, Agent, or Firm—Ingrassia Fisher & Lorenz PC

(57) ABSTRACT

Layers of material deposited exhibit both a local and a global pattern. The local pattern is a function of the underlying wafer surface, but the global pattern is a function of the equipment in which the layer was deposited. Accurate reconstruction of the surface topology of a layer on a product wafer is achieved despite the local pattern by determining the surface topology of a blanket layer on a blank wafer, measuring the thickness of the layer at a few selected locations on a product wafer, calculating scaling coefficients representing deviations of the measured thickness from the blanket layer topology, and then multiplying the blanket layer topology by the scaling coefficients. The surface reconstruction results from modifying the surface topology of the blanket layer so that it has the same thickness at the measured locations as does the product wafer layer.

20 Claims, 3 Drawing Sheets

METHOD FOR PROCESSING A WORK PIECE IN A MULTI-ZONAL PROCESSING APPARATUS

FIELD OF THE INVENTION

This invention relates generally to a method for controlling a process such as a planarization process in a multi-zonal processing apparatus and more particularly to a method for reconstructing the initial condition of an incoming work piece to be processed in that apparatus and to a method for controlling a process implemented on that work piece by utilizing the initial condition reconstruction. In accordance with a specific implementation, the invention relates to a method for reconstructing the initial thickness profile of an incoming work piece to be planarized and to a method for planarizing a work piece by utilizing the profile reconstruction as applied to a multi-zonal planarizing apparatus such as a multi-zonal chemical mechanical planarization apparatus.

BACKGROUND OF THE INVENTION

Many types of processing apparatus include a plurality of zones within each of which some processing variable can be controlled in order to achieve some desired process result when a work piece is processed in the apparatus. For example, the processing apparatus may permit a variable or parameter such as pressure, temperature, voltage, current, or the like to be separately set in each of the plurality of zones to achieve a predetermined parameter distribution profile across the work piece. The predetermined profile, in turn, is intended to achieve a repeatable and predetermined result across the surface of the processed work piece. The process being controlled may be, for example, a polishing process, a planarization process such as a chemical mechanical planarization (CMP) process, a deposition process, or any other process practiced in an apparatus having a plurality of zones in which a process parameter can be adjusted in the various zones of the apparatus.

As an example, the manufacture of many types of work pieces requires the substantial planarization of at least one surface of the work piece. Examples of such work pieces that require a planar surface include semiconductor wafers, optical blanks, memory disks, and the like. One commonly used technique for planarizing the surface of a work piece is the chemical mechanical planarization (CMP) process, a process commonly practiced in a multi-zonal processing apparatus. In the CMP process a work piece, held by a work piece carrier head, is pressed against a moving polishing pad in the presence of a polishing slurry. The mechanical abrasion of the surface combined with the chemical interaction of the slurry with the material on the work piece surface ideally produces a surface of a desired shape, usually a planar surface.

The construction of the carrier head of a CMP apparatus and the relative motion between the polishing pad and the carrier head have been extensively engineered in an attempt to achieve a desired rate of removal of material across the surface of the work piece and hence to achieve the desired surface shape. For example, the carrier head generally includes a flexible membrane that contacts the back or unpolished surface of the work piece and accommodates variations in that surface. One or more pressure chambers are provided behind the membrane so that different pressures can be applied to various zones on the back surface of the work piece to cause desired variations in polishing rate across the front surface of the work piece. The carrier head also generally includes a wear ring that surrounds the membrane and the work piece and that pre-stresses or pre-compresses the polishing pad to protect the leading edge of the work piece. The pressure applied to the wear ring may also be adjusted (providing an additional zone) to aid in determining the polishing rate near the edge of the work piece.

The incoming work piece that is to be planarized generally has a non-uniform surface. That is, the work piece itself or a layer of material on the surface of the work piece has a non-uniform thickness. To achieve the desired (usually planar) final surface, the CMP process must be performed in a substantially non-uniform manner taking into account both the initial variation of material thickness across the work piece surface and the desired final shape. The initial pre-CMP distribution of material thickness and the desired post-CMP thickness determine the required distribution of CMP polishing rate and hence the required distribution of pressure in the various zones of the multi-zonal processing apparatus. Accordingly, to achieve the desired post-processing result, the initial pre-processing thickness distribution must be known or must be determined.

Heretofore there has not been a practical method for determining the surface characteristics of the incoming work pieces. Accordingly, a need exists for a method for determining the surface topology of the incoming work pieces, especially in an efficient and process worthy manner, so that the proper parameter values can be set in the various zones of a multi-zonal processing apparatus in order to achieve the desired final, post-processing surface topology. More generally, a need exists for a method for determining the pre-processing condition of a work piece that is to be processed in a multi-zonal processing apparatus so that a process parameter can be established in each of the zones of the apparatus to achieve the desired post-processing condition for the work piece. Additionally, a need exists for a method to process a work piece in a multi-zonal processing apparatus, such as a CMP apparatus, including properly and efficiently characterizing the pre-processing conditions of the work piece and using such characterization to determine the appropriate value to set for a process parameter in each of the zones of the multi-zonal processing apparatus.

DETAILED DESCRIPTION OF THE INVENTION

Without loss of generality, and for purposes of illustration only, the invention will be described as it applies to a CMP process and specifically as it applies to the CMP processing of a semiconductor wafer in a multi-zonal CMP processing apparatus. In such an apparatus the pressure in each of a plurality of zones may be independently set to achieve the desired surface planarity. It is not intended, however, that the invention be limited to these illustrative embodiments; in fact, the invention is generally applicable to many processes and to the processing of many types of work pieces.

In the processing of a semiconductor wafer to manufacture integrated circuits or other semiconductor devices there are a number of steps in which a layer of insulating material, metal, or other material is formed on at least one surface of the wafer by chemical vapor deposition, physical vapor deposition, plating, or the like (each hereinafter referred to without limitation as "deposition"). Following such a deposition step, it is often desirable to planarize or otherwise configure the surface of the wafer including such layer of deposited material. Hereinafter any such configuration will be referred to as "planarization."

There are generally two patterns, a local pattern and a global pattern, that can be observed in the surface topology of a semiconductor wafer after a deposition process. The local pattern exists within and about an individual chip being formed on the wafer and is usually a function of prior processing steps. The surface topology of the local pattern will vary depending on the location on the chip, and may be different for active areas as compared to field regions and as compared to, for example, scribe grid areas between adjacent chips. Additionally, the surface topology of the local pattern may vary even with location within an active area or within a field area. In contrast, the global pattern is observed in the surface topology across the wafer and is characteristic of the equipment used for the deposition process. That is, each deposition apparatus produces a unique topological distribution on the wafer surface, and this topological distribution can be regarded as a "signature" that is unique to that apparatus. The topological distribution is almost always wafer center symmetric.

Figure 1:
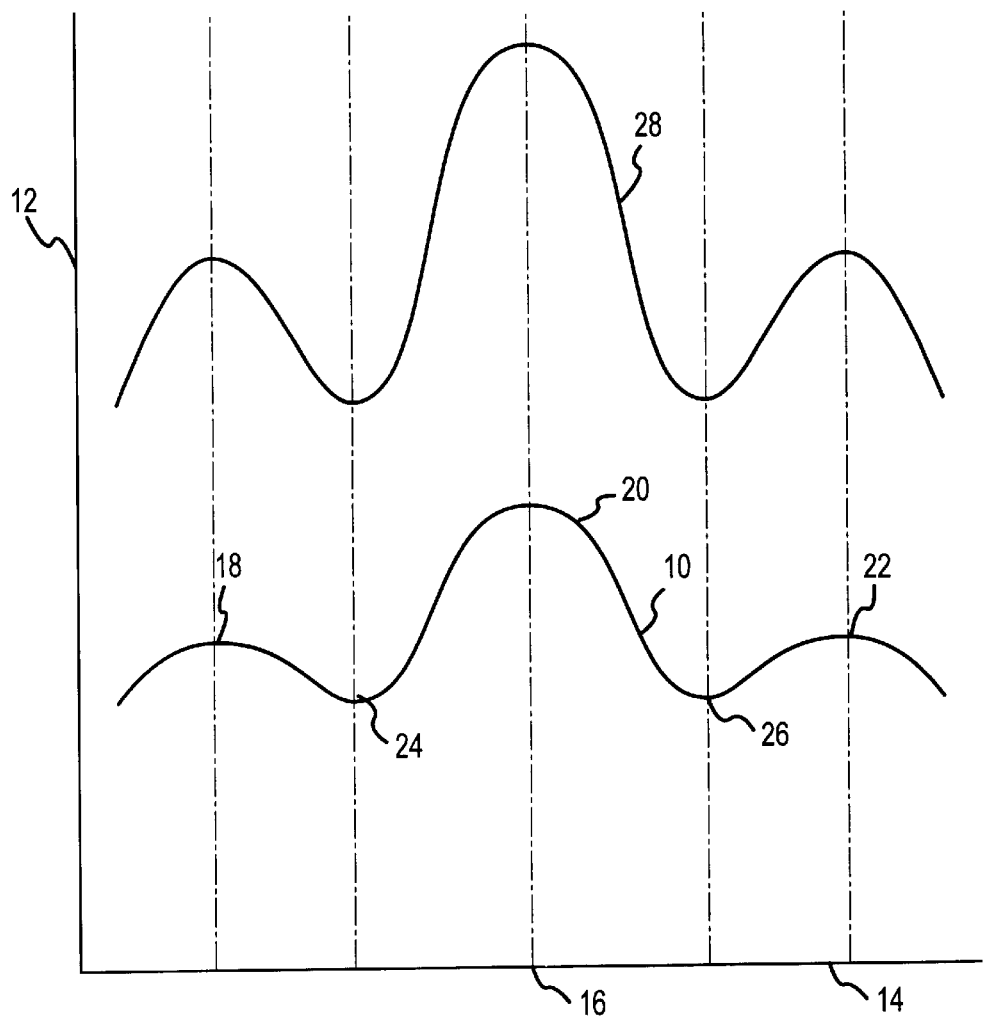
FIG. 1 illustrates, in graphical form, the results of a typical diameter scan that is representative of the thickness variation to be expected of a deposited layer and indicates the signature characteristic of the deposition apparatus in which the layer was deposited.

The global pattern can be measured easily and accurately on a blanket layer; that is, an unpatterned layer that has been deposited across the entire surface of a blank wafer. Such a deposited blanket layer is ideally of uniform thickness across the entire surface, but in actual practice will have the signature topological distribution. The global pattern is typically measured by making 49 measurements (for a 200 millimeter (mm) diameter wafer) or 121 measurements (for a 300 mm wafer) regularly spaced along a diameter of the wafer. One measurement is made in the center of the wafer and the remaining measurements are equally divided with half to the right of the center and half to the left of the center. Although 49 or 121 are the usual number of measurements, any number of measurements can be made. And although the measurements are typically made along a diameter of the wafer, the measurements can be located elsewhere. The type of measurement made depends on the type of material in the deposited film, and can be, for example, an electrical, an optical, or a tactile measurement. FIG. 1 illustrates a typical diameter scan 10 that is representative of the thickness variation of a blanket deposited layer that has been deposited on a blank wafer in a particular deposition apparatus. Vertical axis 12 represents film thickness and horizontal axis 14 represents location along a diameter with the center of the wafer indicated at location 16. In this figure the variations in film thickness across the wafer have been exaggerated to illustrate possible global patterns. Any film deposited in this particular deposition apparatus can be expected to have a similar profile, although the height of the peaks 18, 20, 22 or the depth of the valleys 24, 26 in the distribution will change with the thickness of the deposited film. For example, diameter scan 28 represents the film thickness of a blanket layer deposited in the same deposition apparatus but having a greater nominal film thickness. The general shape of diameter scan 28 is the same as diameter scan 10, with similar locations of the peaks and valleys, but the difference in the height of the peaks and the depth of the valleys is evident.

The local pattern cannot be measured in such an easy and accurate manner. Measuring 49 or 121 locations (or the equivalent number of locations as are measured on a blanket layer) on each production wafer in a production lot would be very time consuming. In addition, because of the variations in the local pattern, measurements from random locations on any given chip might produce spurious results. Because a large number of measurements cannot be made on each wafer, it has become common practice to make measurements at a small number of locations, typically 9 locations. Again, because of variations in the local pattern, 9 locations may not accurately ascertain the surface topology of the wafer.

In accordance with one embodiment of the invention, a surface of a product wafer having thereon a layer of material deposited in a particular deposition apparatus is planarized in a multi-zone CMP apparatus by the following method. A blanket layer of material is deposited on a blank wafer by deposition in the particular deposition apparatus. A plurality of measurements are made of the thickness of the deposited blanket layer, preferably along a diameter of the blank wafer, to produce a topologic diameter scan that is characteristic of layers deposited by the particular deposition apparatus. The diameter scan provides a measurement of the thickness of the blanket layer as a function of radial position on the blank wafer. The diameter wafer scan on the blank wafer represents what is to be expected in terms of a global thickness distribution of deposited material across a product wafer when the deposited material is deposited in the particular deposition apparatus. A small number of measurements then are made of the thickness of the deposited layer at selected positions on the product wafer. Preferably the measurements are made at about 9 locations on the product wafer with the measurements made on the same feature in the same area of the chip at each of the selected positions. The measurements on the product wafer represent an actual thickness distribution of the deposited material on the product wafer as a function of radial position on the product wafer. In accordance with the invention, the measurements from the diameter scan and the measurements from selected positions on the product wafer are then used to reconstruct a thickness profile for the product wafer. Knowing the thickness profile of the product wafer (including the thickness of the layer deposited thereon) or of the layer itself deposited on the wafer surface, and knowing the desired final wafer surface profile, the pressure can be set in each of the various zones of the multi-zone CMP apparatus.

In accordance with one embodiment of the invention, the measurements on both the blank wafer and on the product wafer are assumed to be wafer center symmetric. Assuming such symmetry, the measurements left and right of center on the blanket layer on the blank wafer, at equal radial distances from the center, are averaged to give an averaged center symmetric diameter scan. A polynomial interpolation is applied to the discrete averaged data points to construct a continuous diameter scan line along which the value at each point is indicated by DScan(i), where i indicates the location along the diameter. The interpolated data provides a continuum of layer thickness as a function of radial position for the blanket layer. In accordance with one embodiment of the invention the polynomial interpolation is chosen to be a linear interpolation, although higher order polynomial interpolations could also be applied. The interpolated diameter scan contains details of the deposition profile, characteristic of the deposition equipment used to deposit the layer, but does not represent the real thickness of the deposited layer on a product wafer that is to be processed in the CMP apparatus.

Figure 2:
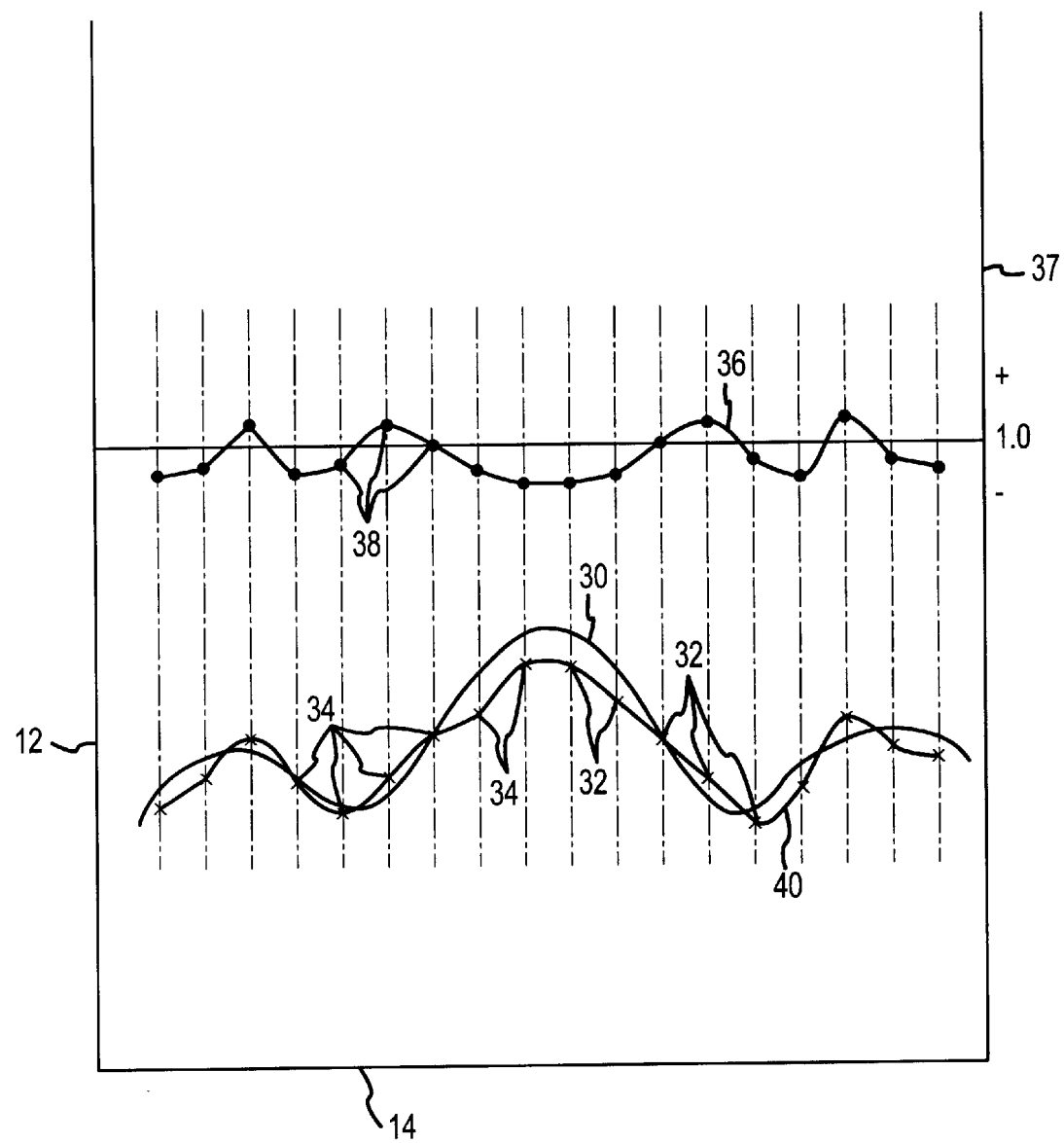
FIG. 2 illustrates, in graphical form, an interpolated work piece diameter scan, thickness measurements made on a product wafer, a scaling coefficient function, and a reconstructed surface topology for the product work piece.

Further in accordance with this embodiment of the invention, the thickness of the deposited film on a product wafer is measured at a number of locations, each of the locations characterized by a radial position on the product wafer. Preferably the thickness is measured at 9 locations and the measurements are made on the same feature at each of the 9 locations. Initially it is preferable that measurements are made at several locations on a single die to determine which location or which feature yields the most representative thickness measurement. Thereafter all of the measurements are made on that feature at each of the 9 locations. Again, wafer center symmetry is assumed, so although the 9 measured locations do not necessarily lie along a diameter, the measurements can be considered as if they were made along a diameter. The coordinates of each measurement location are noted and each measured point on the product wafer is indicated by PScan(j), where j indicates location along the diameter. FIG. 2 illustrates graphically a representative diameter scan 30 made on a blank wafer with interpolation between measured values. Thickness measurements PScan(j) 32 measured on a product wafer are also illustrated in FIG. 2 as are a second set of points 34 generated by assuming wafer center symmetry of the product wafer measurements.

In accordance with an embodiment of the invention, reconstruction of the topology of the product wafer proceeds by calculating a scaling coefficient K(j) corresponding to each of the measured points on the product wafer where $$K(j)=PScan(j)/RScan(j)$$

where RScan(j) is the interpolated value of the diameter scan at location j along the diameter corresponding to the measured value of PScan at that diameter location. The scaling coefficient represents the deviation of the real thickness on the product wafer from the representative thickness at each of the locations measured on the blanket layer on the blank wafer. The calculation of the ratio of the thickness of the deposited layer measured on the product wafer to the thickness of the blanket layer measured on the blank wafer provides a plurality of scaling coefficients as a function of radial position on the product wafer. Based on the calculated scaling coefficients, a continuous scaling coefficient is created by a polynomial interpolation. By interpolating between the calculated scaling coefficients, a continuum of interpolated scaling coefficients, K(i), is created as a function of radial position on the blank wafer. In accordance with one embodiment of the invention, a linear interpolation can be used, although higher order polynomial interpolations can also be employed. A representative continuous scaling coefficient function is illustrated by the line 36 in the top portion of FIG. 2. For the scaling coefficient, a vertical scale 37 indicates the ratio of measured value on the product wafer to the interpolated diameter scan value. The calculated scaling coefficient values are illustrated by the solid circles denominated by the numeral 38. The scaling coefficient function represents the global deviation between the representative scan measured on a blank wafer and the particular product wafer. The reconstructed topology of the product wafer is substantially the diameter scan of the blanket layer on the blank wafer with the diameter scan modified such that it has the same thickness values at the same locations as the 9 locations measured on the product wafer.

In accordance with an embodiment of the invention, the surface topology of the product wafer is reconstructed by multiplying the diameter scan, DScan(i), by the scaling coefficient function to calculate a corrected diameter scan, Th(i), given by $$Th(i)=DScan(i)*K(i)$$

where * indicates multiplication and i is the location along the diameter. The multiplication is done at all points on the diameter scan. The corrected diameter scan, Th(i), indicated in FIG. 2 by the numeral 40, will exhibit the details specific to the signature of the deposition equipment used to deposit the layer on the wafer and simultaneously will be adjusted for actual measurements made on a product wafer.

After reconstructing the topology of the product wafer, the wafer may be processed in a multi-zonal CMP processing apparatus to achieve the desired after-processing surface topology. By knowing both the initial and desired final topologies of the wafer it is possible to ascertain the amount of material that must be removed from the wafer surface as a function of location on that surface top achieve the desired post-processing topology.

In the CMP process the product wafer, held by a wafer carrier head, is pressed against a moving polishing pad in the presence of a polishing slurry. The average removal rate of material from the surface of the wafer, RR, is given by the so called Preston's equation $$RR=k*P*V$$

where k is a coefficient depending on the slurry used, the distribution of the slurry, and a number of other factors, V is the relative velocity between the surface of the wafer and the polishing pad, P is the polishing pressure, and * is the multiplication function. The equation can be modified to give the removal rate RR(x) at any location x on the wafer surface:

$$RR(x)=k(x)*P(x)*V(x)$$

where k(x), V(x) and P(x) are the polishing coefficient, relative velocity, and polishing pressure, respectively, as a function of position on the wafer surface. In the conventional CMP apparatus the motion of the polishing pad and/or the wafer, the slurry distribution and other factors are carefully controlled so that k(x) and V(x) are substantially constant across the surface of the wafer. In one type of CMP apparatus, for example, the relative velocity is held substantially the same at all locations on the surface by moving the polishing pad in a controlled orbital motion while the wafer is rotated about an axis perpendicular to the surface to be polished. With k(x) and V(x) substantially constant, the localized removal rate is proportional to the localized polishing pressure and a desired removal rate profile, RR(x), is thus achieved by establishing a predetermined localized pressure profile, P(x). A multi-zonal CMP apparatus is designed to provide the ability to control the localized pressure profile during the CMP processing of a wafer. The apparatus includes a diaphragm that presses against the upper surface of wafer and causes the lower surface of the wafer to be pressed against a polishing pad. A plurality of plenums within which the pressure can be adjusted are established behind the diaphragm. The pressure in each plenum is then locally transferred to a selected region of the wafer. As an example, a multi-zonal CMP apparatus might include three zones, but more or fewer zones could also be implemented. The three zones include a central zone surrounded by two concentric zones, a configuration that is well suited for the polishing of a wafer having a wafer center symmetry. An additional pressure zone that influences the polishing of the edge portion of the wafer is provided by a pressure adjustable wear ring that closely surrounds the wafer and the diaphragm. In more sophisticated CMP equipment, adjustable pressure can also be applied to the barriers that divide the plenums so that a more precisely controlled pressure pattern can be established.

Figure 3:
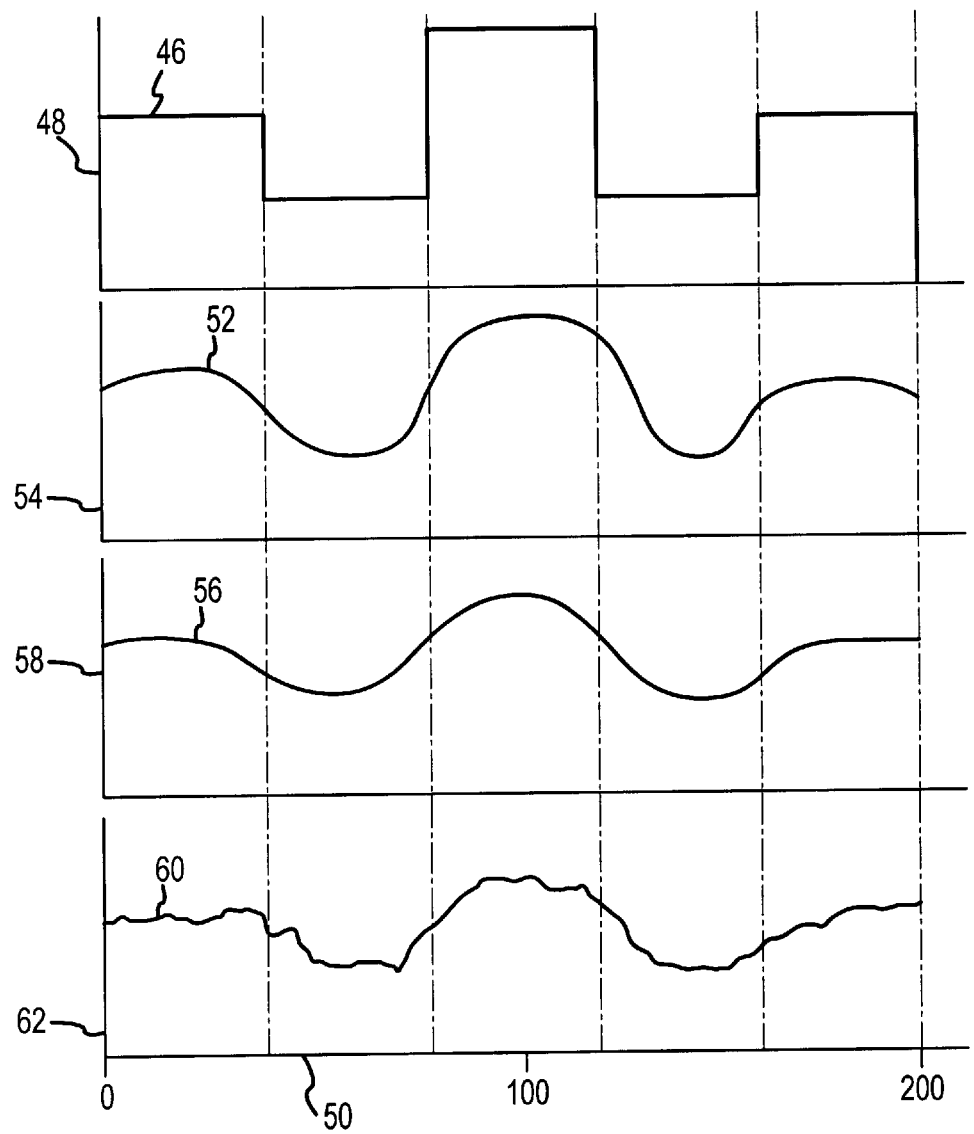
FIG. 3 illustrates, in graphical form, an example of the pressure distribution in the three zones of a multi-zonal processing apparatus, the resulting pressure distributions on the upper and lower surfaces of a work piece, and the resulting removal rate of material from the lower surface of the work piece.

FIG. 3 illustrates, in graphical form, one example of the pressure distribution in the three zones of the wafer carrier, the resulting pressure distribution on the upper surface of a product wafer, the resulting pressure distribution on the lower surface of the wafer, and the resulting removal rate of material from the lower surface of the wafer. For simplification, the pressure exerted by the wear ring and the pressure exerted on the barriers between plenums is not illustrated. Curve 46 illustrates the pressure $P(Z_m)$ in each of the zones where m is the zone number. The vertical axis 48 indicates pressure in pounds per square inch (psi), and horizontal axis 50 indicates position across the diaphragm in mm. As an illustrative example, the pressure in the central zone can be 3 psi, the pressure in the inner concentric zone can be 1 psi, and the pressure in the outer concentric zone can be 2 psi. Curve 52 illustrates the pressure distribution measured at the upper surface of the wafer as a result of the pressures set in those three zones. Vertical axis 54 again indicates pressure in psi. Because of edge effects and cross talk at the edges of the zones and nonuniformities in the diaphragm, there is a smearing and alteration of the pressure distribution so that the pressures measured in the zones $Z_m$ are not the same as those measured on the upper surface of the wafer. Curve 56 illustrates the pressure distribution that would be measured on the lower surface of the work piece. Again, vertical axis 58 indicates pressure in psi. A further smearing of the pressure distribution is observed as a result of the generally rigid nature of the wafer. The relationship between the pressures set in the three zones and as illustrated by curve 46 and the pressures actually present at the lower surface of the wafer, the surface to be planarized, as illustrated by curve 56, represents an analytical model of the processing apparatus. That is, the localized pressure profile $P_Z(x)$ exerted between the surface of the wafer and the polishing pad is a function of but is not identical to the pressure $P(Z_m)$ established in each of the zones m. Curve 60 illustrates the removal rate of material from the surface of the wafer as a result of the CMP process with the pressures set in the three zones as illustrated by curve 46. Vertical axis 62 corresponding to curve 60 indicates normalized removal rate of material where the localized removal rate is normalized to the mean removal rate.

In accordance with one embodiment of the invention, because the localized removal rate is proportional to the localized polishing pressure, a revised localized removal rate can be determined in accordance with $$RR_{new}(x) = RR_{old}(x) * P_{new}(x)/P_{old}(x)$$

where $RR_{new}(x)$ and $RR_{old}(x)$ are the new and old localized removal rates, respectively, and $P_{new}(x)$ and $P_{old}(x)$ are the new and old localized polishing pressure profiles, respectively.

In accordance with a further embodiment of the invention a planarization process, such as a CMP process, conducted in a multi-zonal process apparatus can be controlled in the following manner. For purposes of illustration only, but without limitation, consider the chemical mechanical planarization of a semiconductor wafer in a CMP apparatus having three zones in each of which the polishing pressure can be adjusted, such as in the CMP apparatus described above. In such an apparatus the localized removal rate of material from the surface of a work piece is proportional to the localized pressure with which the semiconductor wafer is pressed against a polishing pad. As a first step the surface topology of the wafer to be planarized is reconstructed in the manner described above. The reconstructed surface topology is compared to the desired after-process surface topology to determine the amount of material that must be removed from the wafer surface as a function of position x on the wafer surface and to determine a desired or target localized removal rate profile, $RR_t(x)$. The amount of material to be removed is the difference between the incoming topology and the desired after-processing topology. The desired after-processing topology may be a substantially planar surface, but also can be any other surface profile. In accordance with this embodiment of the invention, the blanket wafer and the wafer for which the surface topology was reconstructed are then processed in the CMP apparatus using an initial pressure setting $P_1(Z_1)$, $P_1(Z_2)$, and $P_1(Z_3)$ respectively in the three zones. The surface of the blanket wafer is again measured after processing to produce a diameter scan for that wafer and the product wafer is again measured in the same 9 locations as were measured pre-processing. The post-processing surface topology of the product wafer is reconstructed in the same manner as previously described, and using this data the resultant localized removal rate, $RR_1(x)$, is determined. The resultant test removal rate profile $RR_1(x)$ is the removal rate profile achieved with the pressures in the three zones set to $P_1(Z_m)$. Next the difference between the target removal rate profile and the achieved removal rate profile is calculated. Preferably the difference is calculated by calculating the standard deviation, but other metrics can also be used. In a preferred embodiment of the invention the following steps are then followed to determine modified pressure settings for each of the three zones of the processing apparatus that will be used to achieve an optimum result with subsequently processed wafers. The optimum result is a removal rate profile that is as close to the target removal rate as can be achieved with the processing apparatus. Starting from the pressure settings $P_1(Z_m)$, the removal rate profile expected for a change in the pressure in at least one of the three zones from the pressure $P_1(Z_m)$ to a new pressure $P_2(Z_m)$ is calculated using the relationship $$RR_2(x) = RR_1(x) * P_2(X)/P_1(x),$$

or in general, the relationship $$RR_{n+1}(x) = RR_n(x) * P_{n+1}(x)/P_n(x)$$

where n+1 denotes the state to be calculated and n denotes the most recent state for which a calculation has been made. After each such calculated change in removal rate profile, the new removal rate profile is compared to the target removal rate profile to determine whether or not the change in pressure would cause the new removal rate profile to approach the desired target removal rate profile. Preferably the effect of changes in the zonal pressures is systematically explored until no change in the pressure in any of the zones further reduces the difference between the calculated expected removal rate profile and the target removal rate profile. In a preferred embodiment, after determining the removal rate profile $RR_1(X)$ corresponding to the initial pressure settings $P_1(Z_m)$, the removal rate profile, $RR_2(x)$, that would result from a small change in the pressure in zone 1, such as an increase in the pressure in that zone by 1% ($P_2(Z_1)=(1.01)P_1(Z_1)$), is calculated using the above equation. The standard deviation between that newly calculated removal rate profile, $RR_2(x)$, and the target removal rate profile, $RR_t(x)$, is calculated. If that standard deviation is less than the standard deviation between $RR_1(x)$ and $RR_t(x)$, the new pressure, $P_2(Z_1)$, in zone 1 is retained. If the standard deviation increases, a new removal rate profile is calculated that corresponds to a small change in pressure in zone 1 in the opposite direction, such as a decrease in the pressure in that zone by 1% ($P_3(Z_1)=(0.99)P_1(Z_1)$). Again, the standard deviation between the newly calculated removal rate profile and the target removal rate profile is calculated. If that standard deviation is less than the standard deviation between $RR_1(x)$ and $RR_t(x)$, the new pressure, $P_3(Z_1)$, in zone 1 is retained. If the standard deviation increases, the initial pressure in that zone, $P_1(Z_1)$, is retained. These steps are repeated for each zone of the apparatus. In this manner, the result of small changes in pressure, either increases or decreases, on the calculated removal rate profile are investigated. Pressure changes that result in a decrease in the standard deviation between the calculated removal rate profile and the target removal rate profile are retained. After the result of small pressure changes are investigated for each zone, the process is repeated for each zone using the retained pressures as the starting pressure in each zone. This investigation is continued until no further decreases in the standard deviation are observed. The values of pressure in each zone that result in the minimum standard deviation are then used as the operating pressures to process the next wafer through the CMP process.

Semiconductor wafers, like many work pieces, are often processed in batches or lots. A lot may contain, for example, a number of similar work pieces. Each work piece in a lot can be processed in the manner just described. The initial surface profile of each work piece is reconstructed in the manner described above and a target removal rate profile, $RR_t(x)$, is determined for that work piece. The proper settings for each of the zones are determined by iteratively calculating removal rate profiles that would result from iterative changes in the process parameter in each of the plurality of zones in the processing apparatus. The process parameters chosen for each zone to process the work piece are those parameters that achieve the minimum difference between the removal rate profile for those parameters and the target removal rate profile. In accordance with a further embodiment of the invention, as each work piece is processed, the surface topology of that work piece can be reconstructed and used as the test work piece for determining the proper values of the process parameter to set in each of the plurality of zones for processing the next work piece. In accordance with this embodiment of the invention, information about the incoming surface profile and the desired after-processing profile together determine the target removal rate profile, $RR_t(x)$. The after-processing profile of the previous work piece provides information about the actual, achieved removal rate profile and is used as the initial removal rate profile, $RR_n(x)$, for the next work piece. In this manner the inventive algorithm will compensate for potential drift in the process, including, for example, changes in slurry properties, pressure transducer properties, and the like, as well as drift in material properties such as the hardness of the material being removed.

It is apparent from the foregoing that there has been described and illustrated a method for controlling a process in a multi-zonal processing apparatus and for reconstructing the initial condition of an incoming work piece to be processed in such an apparatus that fully meets the needs set forth above. Although the invention has been described and illustrated with specific reference to the CMP processing of semiconductor wafers, the invention is not so limited. Instead, the invention is widely applicable to the processing of many types of work pieces in many types of multi-zonal processing apparatus. The invention is generally applicable to the processing of any work piece that has a layer of material deposited thereon by a deposition apparatus that produces a repeatable surface topology or signature. Those of skill in the art will recognize that there are many possible variations and modifications of the examples set forth. For example, although steps in the invention have been described in terms of creating a diameter scan and comparing results to that diameter scan, a radial scan or other regular scan could also be used. It is intended to include within the invention all such variations and modifications as encompassed within the appended claims.

What is claimed is:

1. A method for reconstructing the surface topology of a product work piece having a layer deposited thereon by a deposition apparatus, the method comprising the steps of:

providing a blank work piece having a blanket layer deposited on a surface thereof by the deposition apparatus;

measuring the thickness of the blanket layer at a first plurality of locations, each of the first plurality of locations characterized by a radial position, to determine a first plurality of data points of thickness of the blanket layer as a function of radial position on the surface;

interpolating between the first plurality of data points to determine a continuum of interpolated thickness of the blanket layer as a function of radial position;

providing a product work piece having a deposited layer thereon, the deposited layer deposited in the deposition apparatus;

measuring the thickness of the deposited layer at a second plurality of locations, each of the second plurality of locations characterized by a radial position on the product work piece;

calculating the ratio of the thickness of the deposited layer at each of the second plurality of locations to the interpolated thickness of the blanket layer at a corresponding radial position to determine a second plurality of data points of ratio as a function of radial position;

interpolating between the second plurality of data points to obtain a continuum of interpolated ratios as a function of radial position; and multiplying the first plurality of data points of thickness by the interpolated ratios at corresponding radial positions to reconstruct the surface topology of the product work piece.

2. The method of claim 1 wherein the step of measuring the thickness of the blanket layer comprises measuring the thickness at a first plurality of locations along a diameter of the blank work piece.

3. The method of claim 1 wherein the step of interpolating between the first plurality of data points comprises the step of performing a polynomial interpolation between the first plurality of data points.

4. The method of claim 3 wherein the step of performing a polynomial interpolation comprises the step of performing a linear interpolation.

5. The method of claim 1 wherein the step of measuring the thickness of the deposited layer comprises the step of measuring the thickness of the deposited layer at a second plurality of locations less than the first plurality of locations.

6. The method of claim 5 wherein the step of measuring the thickness of the deposited layer comprises the step of measuring the thickness at a single selected feature at each of the second plurality of locations.

7. The method of claim 1 wherein the step of interpolating between the second plurality of data points comprises the step of performing a polynomial interpolation between the second plurality of data points.

8. The method of claim 7 wherein the step of performing a polynomial interpolation comprises the step of performing a linear interpolation.

9. The method of claim 1 further comprising the step of planarizing the surface of the product work piece in a multi-zonal chemical mechanical planarization apparatus in which a process parameter has been set in each of a plurality of zones of the apparatus in response to the reconstruction of the surface topology of the product work piece.

10. A method for reconstructing the topology of the surface of a deposited layer on the surface of a work piece comprising the steps of:

providing a product work piece having a layer of material deposited thereon by a deposition apparatus;

providing a blank work piece having a blanket layer of material deposited thereon by the deposition apparatus;

determining the surface topology of the blanket layer;

measuring the thickness of the layer of material at a plurality of locations on the surface of the product work piece;

calculating scaling coefficients representing deviation of the measured thickness of the layer of material from the topology of the blanket layer; and determining a reconstruction of the topology of the surface of the layer of material by multiplying the topology of the blanket layer by the scaling coefficients.

11. The method of claim 10 wherein the step of determining the surface topology comprises the steps of:

measuring the thickness of the blanket layer at a plurality of locations along a diameter of the work piece; and interpolating between the measurements of thickness of the blanket layer at the plurality of locations to determine a continuum of thickness values of the blanket layer along the diameter.

12. The method of claim 11 further comprising the steps of:

assuming the surface topology of the blanket layer is work piece center symmetric; and averaging measurements of thickness of the blanket layer made at equal radial distances from but on opposite sides of the work piece center.

13. The method of claim 12 wherein the step of measuring the thickness of the layer of material comprises the step of measuring the thickness of the layer of material at a plurality of radial distances from the center of the product work piece.

14. The method of claim 13 wherein the step of calculating scaling coefficients comprises the step of calculating the ratio of the thickness of the layer of material measured at the plurality of radial distances to the interpolated thickness value of the blanket layer at corresponding radial distances.

15. The method of claim 14 further comprising the step of interpolating between the scaling coefficients calculated for each of the plurality of radial distances.

16. The method of claim 15 wherein the step of interpolating between the scaling coefficients comprises the step of polynomial interpolating between the scaling coefficients.

17. The method of claim 10 wherein the step of proving a product work piece comprises providing a product work piece characterized by a symmetrically repeated pattern on the surface thereof, each of the symmetrically repeated patterns having a plurality of features, and the step of measuring the thickness of the layer of material comprises the step of measuring the thickness of the layer overlying a selected one of the plurality of features on each of a selected number of the symmetrically repeated patterns.

18. A method for processing a work piece having a layer of material deposited thereon in a multi-zonal processing apparatus comprising the steps of:

providing a test work piece having a first layer of material deposited thereon;

providing a product work piece having a second layer of material deposited thereon;

determining a reconstruction of the topology of the surface of the second layer of material;

determining a desired post-processing surface topology of the product wafer;

determining the difference between the topology of the surface of the second layer of material and the desired post-processing surface topology;

setting an initial parameter in each of the zones of the multi-zonal processing apparatus in response to the difference determined;

processing the test work piece and the product work piece in the multi-zonal processing apparatus using the initial parameters in each of the zones;

determining a post-processing reconstruction of the topology of the surface of the product work piece; and adjusting the parameter in at least one of the zones of the multi-zonal processing apparatus in response to the post-processing reconstruction.

19. The method of claim 18 wherein the step of determining a reconstruction comprises the steps of:

measuring the surface topology of the test work piece;

measuring the thickness of the second layer of material on the product work piece at a plurality of locations; and modifying the surface topology of the test work piece such that it has the same thickness as the thickness of the second layer of material at the plurality of locations.

20. The method of claim 19 wherein the step of processing the test work piece and the product work piece comprises the step of processing the test work piece and the product work piece in a multi-zonal chemical mechanical planarization apparatus.

* * * * *